(12) United States Patent
Dähn et al.

(10) Patent No.: US 6,601,194 B1
(45) Date of Patent: Jul. 29, 2003

(54) CIRCUIT CONFIGURATION FOR REPAIRING A SEMICONDUCTOR MEMORY

(75) Inventors: Wilfried Dähn, Celle (DE); Peter Pöchmüller, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/580,034

(22) Filed: May 26, 2000

(30) Foreign Application Priority Data

May 26, 1999 (DE) .......................... 199 24 153

(51) Int. Cl.⁷ ................................. H02H 3/05
(52) U.S. Cl. ...................... 714/42; 714/711; 365/96; 365/200; 365/237
(58) Field of Search ............... 714/42, 710, 711; 438/601; 257/529; 365/96, 103, 128, 200, 201, 208, 212, 217, 225.7, 237

(56) References Cited

U.S. PATENT DOCUMENTS

| | | | | |
|---|---|---|---|---|
| 4,476,375 A | * | 10/1984 | Ogawa ................. 219/121.72 |
| 4,503,315 A | * | 3/1985 | Kamioka et al. ...... 219/121.65 |
| 5,272,671 A | * | 12/1993 | Kudo et al. ................ 365/200 |
| 5,313,424 A | | 5/1994 | Adams et al. |
| 5,381,370 A | * | 1/1995 | Lacey et al. ............... 365/200 |
| 5,500,822 A | * | 3/1996 | Han .......................... 365/200 |
| 5,696,723 A | * | 12/1997 | Tukahara .................. 365/200 |
| 5,991,218 A | * | 11/1999 | Kushiyama ............... 365/222 |
| 6,078,540 A | * | 6/2000 | Keeth ....................... 365/226 |
| 6,115,300 A | * | 9/2000 | Massoumi et al. ........ 365/200 |
| 6,121,074 A | * | 9/2000 | Prein ......................... 438/132 |
| 6,160,302 A | * | 12/2000 | Palagonia .................. 257/529 |
| 6,268,638 B1 | * | 7/2001 | Brintzinger et al. ....... 257/529 |
| 6,434,063 B1 | * | 8/2002 | Nishio et al. .............. 365/200 |

* cited by examiner

*Primary Examiner*—Robert Beausoliel
*Assistant Examiner*—Rita Ziemer
(74) *Attorney, Agent, or Firm*—Laurence A. Greenberg; Werner H. Stemer; Ralph E. Locher

(57) ABSTRACT

A semiconductor memory of an integrated circuit has memory cells that are combined to form individually addressable normal units and redundant units for replacing normal units. The semiconductor memory has a selection circuit for selecting one of the redundant units. A non-volatile first memory unit for storing an address, which can be programmed by an energy beam, of a normal unit to be replaced is provided. A non-volatile second memory unit for storing an address, which can be programmed via electrical contact is also provided. The first and second memory units are connected to the selection circuit for transmitting their respective stored information to the selection circuit. A repair can thus be carried out on the unhoused semiconductor memory and on the housed semiconductor memory. Since only a sufficient portion of all the redundant circuits to be provided are configured in such a way, this allows a space requirement that is smaller overall.

6 Claims, 3 Drawing Sheets

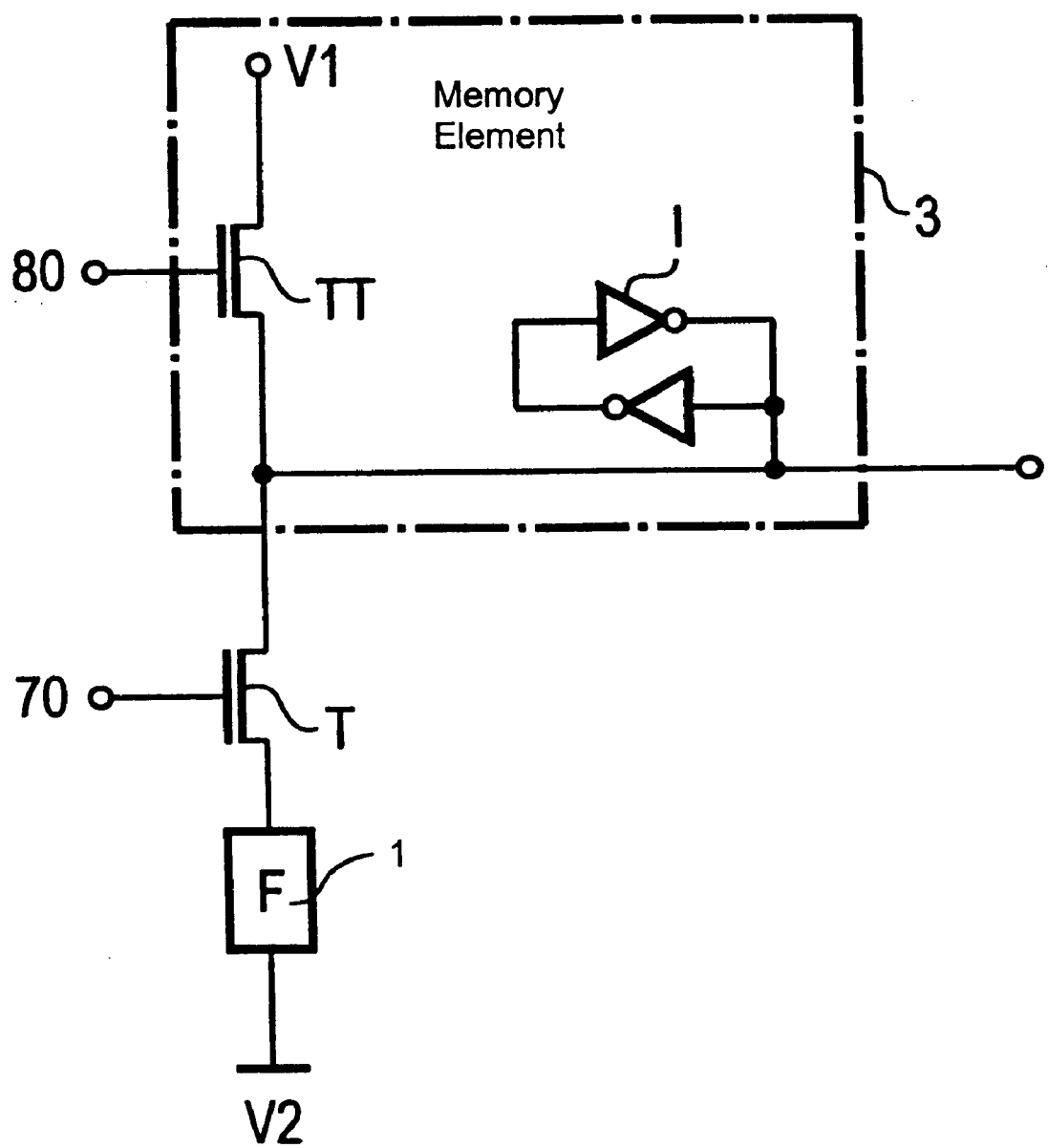

CIRCUIT CONFIGURATION FOR REPAIRING A SEMICONDUCTOR MEMORY

BACKGROUND OF THE INVENTION

Field of the Invention

The invention relates to a circuit configuration in an integrated semiconductor memory for repairing defective memory cells.

Integrated semiconductor memories generally have redundant word lines or redundant bit lines for repairing faulty memory cells, which can replace the addresses of regular lines with defective memory cells. In this case, the integrated memory is tested using, for example, an external test device or a self-test device, and the redundant elements are then programmed. A redundant circuit then has programmable elements, for example in the form of laser fuses or electrically programmable fuses, which are used for storing the address of a line to be replaced. The laser fuses and the electrically programmable fuses are electrical connecting elements whose line resistance can be changed, for example during the production process of the memory, by use of a laser beam or a so-called burning voltage. Laser fuses are normally programmed by an external programming apparatus, which generates a laser beam that is aimed at the relevant integrated circuit. However, this is dependent on the semiconductor module not yet having been packaged in a housing with the integrated circuit. To program electrically programmable fuses, an appropriate external programming apparatus, which is generally different to that mentioned above, applies a burning voltage at a high potential level to the circuit. The programming process is then carried out, for example, by use of a high current, which leads to the conductor track resistance of the fuse being changed permanently, for example by causing the appropriate fuse to melt.

A functional test of a semiconductor memory with subsequent repair is normally carried out in a plurality of steps: in a first test configuration, functional tests are carried out on an unhoused semiconductor module (wafer level test), and defects that are found are repaired by programming the laser fuses. In a further test configuration, functional tests are carried out on the housed semiconductor module (module test). These are used to detect defects that were not possible to detect by the tests on the unhoused semiconductor module. However, in contrast to defects that are found in a wafer-level test, these defects cannot be repaired by use of laser fuses, even if there are a sufficient number of unused redundant elements on the semiconductor module.

The housed semiconductor module can be repaired in the appropriate test configuration by programming electrical fuses since they can be programmed via electrical contact even after the semiconductor module has been fitted in a housing. However, in comparison to laser fuses, electrically programmable fuses have the disadvantage that they occupy a considerably greater amount of space on the semiconductor module due, in particular, to relatively complex drive circuitry. This results in a considerably increased space requirement for redundant circuits with purely electrically programmable fuse banks. Since previous redundant circuits with laser fuse banks have generally been matched to the layout grid of a memory cell array of a semiconductor memory, a redundant circuit using purely electrically programmable fuse banks instead of laser fuse banks would result in a layout change in the configuration process.

SUMMARY OF THE INVENTION

It is accordingly an object of the invention to provide a circuit configuration for repairing a semiconductor memory that overcomes the above-mentioned disadvantages of the prior art devices of this general type, which repairs defective memory cells, in which a repair can be carried out on an unhoused and on an housed semiconductor memory, and which allows the redundant circuits to be provided to have as small an area requirement as possible, overall.

With the foregoing and other objects in view there is provided, in accordance with the invention, an integrated semiconductor memory, including:

memory cells, some of the memory cells are combinable to form individually addressable normal units, and others of the memory cells are combinable to form individually addressable redundant units for replacement of the normal units;

a selection circuit is connected to the memory cells for selecting one of the redundant units and has an input;

a non-volatile first memory unit for storing an address of one of the normal units to be replaced and has an output connected to the input of the selection circuit for transmission of the address stored in the first memory unit to the selection circuit, the first memory is programmable by an energy beam for programming the address; and a non-volatile second memory unit for storing a further address of a normal unit to be replaced and has an output connected to the input of the selection circuit for transmission of the further address stored in the second memory unit to the selection circuit, the second memory unit programmable by electrical contact for programming the further address.

The integrated semiconductor memory has memory cells that are combined to form individually addressable normal units and redundant units for replacing the normal units. A non-volatile first memory unit is used for storing an address, which is supplied from outside the integrated circuit (which is a component of the integrated semiconductor memory) by use of an energy beam produced there, of a normal unit to be replaced. A non-volatile second memory unit is used for storing an address that can be supplied via electrical contact with the integrated circuit. The first memory unit and the second memory unit are connected to a selection circuit for selecting one of the redundant units for transmitting the address stored in the first memory unit or the address stored in the second memory unit to the selection circuit.

The first memory unit contains, for example, a laser fuse bank or a fuse bank with comparable compact programmable elements, which can be cut through by an externally supplied energy beam. Such devices also include, for example, fuses that can be cut through mechanically. The second memory unit contains, for example, a fuse bank with electrically programmable fuses. The selection circuit may be in the form of an address decoder which, when a memory access occurs, replaces the address of the faulty normal unit by the address of the associated fault-free redundant unit.

The invention is suitable for any desired memories in which defective units are repaired by use of redundant units. The normal units are, for example, regular word or-bit lines, and the redundant units are redundant word or bit lines. However, instead of individual word or bit lines, it is also possible to replace relatively large units of memory cells, for example individual memory cell blocks, by appropriate redundant units.

The circuit configuration according to the invention thus provides a selection circuit to which data can be written not only by the first memory unit but also by the second memory unit. In consequence, repair information for the associated redundant element may be read either from a laser fuse bank or from an electrically programmable fuse bank. Initially, further components are required for the relevant redundant circuit for this purpose. In order to keep the space requirement for all the redundant circuits that need to be provided as small as possible overall, it is expedient to provide an additional electrically programmable fuse bank, as well as a laser fuse bank, only for a sufficiently small proportion of the redundant elements.

First, this avoids the necessity to provide dedicated redundant units for a repair after being packaged in a housing. The existing redundancy can be fully utilized for a repair on the unhoused module, since all the redundant circuits have a laser fuse bank. A redundancy analysis that follows a wafer-level test is as a consequence simplified, since all the redundancy on the semiconductor module can be included in a repair strategy. Second, the considerably increased space requirement for repair solutions with purely electrically programmable fuse banks is avoided. The electrically programmable fuse banks to be provided, whose number, as described, is limited, can advantageously be accommodated in an area in which the layout of the circuit is not governed by line separations in the memory cell array. Such areas are located, for example, under line buses of the integrated circuit. In this case, the accommodation has a neutral effect on the surface area. No layout change is required to the memory cell array.

In one embodiment, the first memory unit and the second memory unit are connected to the selection circuit via a volatile third memory unit. A volatile memory unit, for example an address register or address latch, can have information written into it without any problems, for example by a self-test unit, since there is no need for any large currents or voltages greater than the normal signal level of the memory for this purpose. The volatile memory unit contains volatile memory elements whose stored information is lost when the voltage supply is switched off. The purpose of providing the abovementioned non-volatile memory units is that the self-test of the memory does not need to be repeated in this case whenever the volatile memory unit has lost the address stored in it. Otherwise, if only one volatile memory unit were provided, the address of the normal unit to be replaced would have to be redetermined once again, for example whenever the memory was initialized, by of the self-test. In consequence, the address is permanently stored in a non-volatile memory unit. Following this, the address stored in a non-volatile memory unit must be transmitted to the volatile memory unit in order to restore the memory contents of the volatile memory unit, for example whenever the memory is initialized following application of the supply voltage. In this circuit configuration, the already existing volatile third memory unit can be used by both the first memory unit and the second memory unit, thus allowing the area required to be kept small.

In a further embodiment of the circuit configuration, the first memory unit and the second memory unit are connected in series with one another, so that the address stored in the second memory unit is transmitted to the selection circuit via the first memory unit. A precondition for this is that the memory elements of the first memory unit have not yet been programmed, that is to say the redundant element associated with the relevant fuse bank has not yet been used for repairing a defect. The memory elements in the first memory unit in this case represent a low-resistance connection when in the non-programmed state, so that the information is transmitted through these memory elements.

The address stored in the second memory unit and which is composed of a plurality of address bits may be transmitted in serial or parallel form via an appropriate number of outputs from the second memory unit. In these cases, the decision is made following a cost-effectiveness analysis. In the former case, the space required is correspondingly small owing to the minimal number of lines required, but this results in long transmission times. In the latter case, the transmission times are relatively short, but a correspondingly greater number of connecting lines are required. Compromise solutions are, however, also possible, for example parallel transmission of a subset of address bits of the respective address to be read.

In accordance with an added feature of the invention, the first memory unit has an input connected to the output the second memory unit, and the output of the first memory unit is connected to the input of the selection circuit for transmitting the further address stored in the second memory unit through the first memory unit to the selection circuit.

In accordance with an additional feature of the invention, the input of the first memory unit is one of a plurality of inputs, and the output of the second memory unit is one of a plurality of outputs connected in series to at least one of the inputs of the first memory unit.

In accordance with another feature of the invention, the input of the first memory unit is one of a plurality of inputs, and the output of the second memory unit is one of a plurality of outputs connected in parallel to corresponding ones of the inputs of the first memory unit.

In accordance with a concomitant feature of the invention, the first memory unit and the second memory unit each contain non-volatile memory elements, the non-volatile memory elements of the first memory unit contain laser fuses, and the non-volatile memory elements of the second memory unit contain electrically programmable fuses.

Other features which are considered as characteristic for the invention are set forth in the appended claims.

Although the invention is illustrated and described herein as embodied in a circuit configuration for repairing a semiconductor memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a circuit diagram of a detail of the circuit configuration shown in FIG. 1.

DESCRIPTION OF THE PREFERRED EMBODIMENTS

Figure 1A:
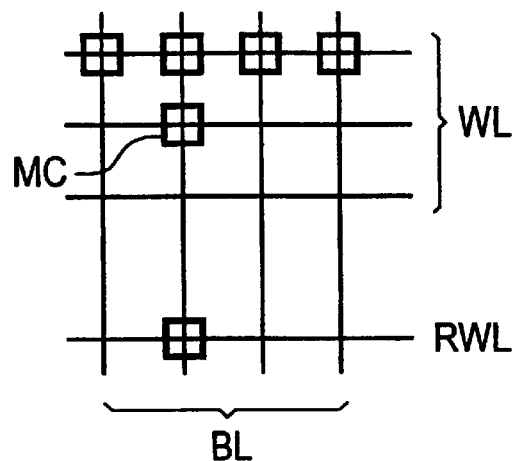
FIG. 1a is a block circuit diagram of a memory cell.

In all the figures of the drawing, sub-features and integral parts that correspond to one another bear the same reference symbol in each case. Referring now to the figures of the drawing in detail and first, particularly, to FIGS. 1a and 1b thereof, there is shown, by way of example, a DRAM memory cell array organized in the form of a matrix, which has regular word lines WL and bit lines BL at whose intersections memory cells MC are disposed (FIG. 1a). To assist understanding, the invention will be explained with respect to only a single redundant word line RWL, so that only one of the regular word lines WL can be repaired. In practice, an integrated memory generally has a plurality of redundant word lines or, in general form, redundant units for replacing normal units, with a corresponding number of redundant circuits.

Figure 1B:
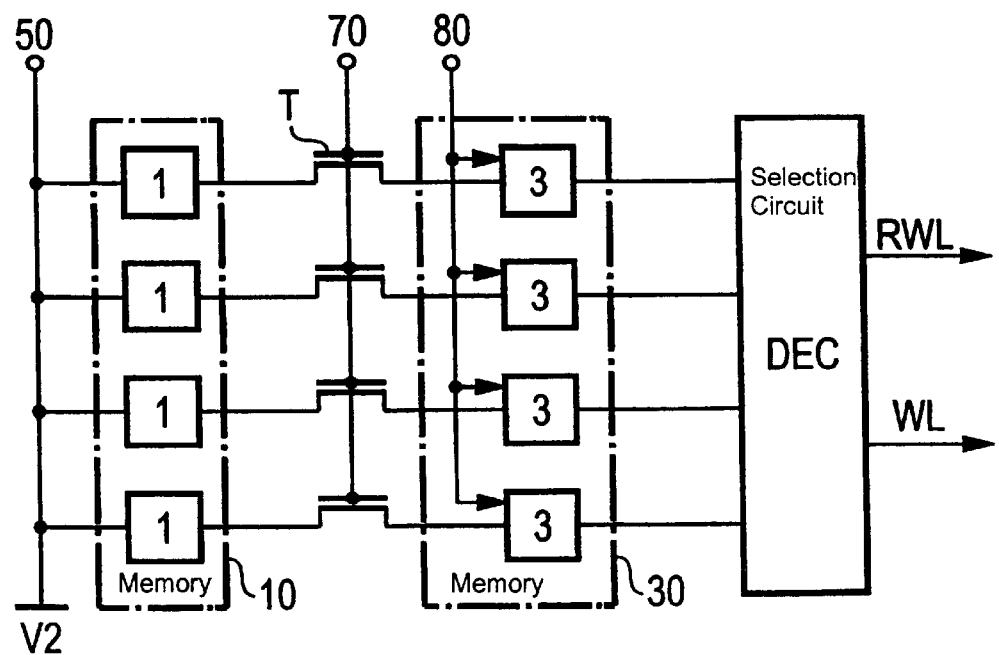
FIG. 1b is a block circuit diagram of a circuit configuration for repairing defective memory cells, with a volatile memory unit and a non-volatile memory unit according to the invention.

FIG. 1b shows a circuit configuration, in which an address of a defective normal unit, in the example above a word line WL, is stored in memory elements 3 of a volatile memory unit 30. In this example, the address contains four address bits, each of which is associated with one of the memory elements 3. The address is supplied to a selection circuit DEC which, when a memory access is made, replaces the address of the faulty unit WL by the address of the fault-free redundant unit, in the example above the redundant word line RWL. Furthermore, the address is permanently stored in a memory unit 10 and is transmitted via a switching device T to the memory unit 30, for example after initialization of the semiconductor memory. The memory unit 10 contains non-volatile memory elements 1, which have elements that can be programmed by an energy beam, in this case in the form of laser fuses. The non-volatile memory elements 1 are connected first to the switching device T and second to a line 50, which is at a potential V2, for example a reference-earth potential of the integrated circuit. The non-volatile memory elements 1 have a low resistance in the unprogrammed state, and a high resistance in the programmed state.

FIG. 2 shows the non-volatile memory element 1 in the form of a laser fuse F and the volatile memory element 3, also referred to as a fuse latch, in the form of a hold circuit containing two back-to-back connected inverters I. A signal on a line 80 is used first of all to apply a "logic 1" value, which corresponds, for example, to the value of an internal supply potential V1, to the fuse latch 3 via a switching element TT. A signal on a line 70 is then used to drive the transistor T, resetting the fuse latch 3, depending on the state of the fuse F, to a "logic 0" value which corresponds, for example, to the potential V2, or it is left in the "logic 1" state.

Figure 3:
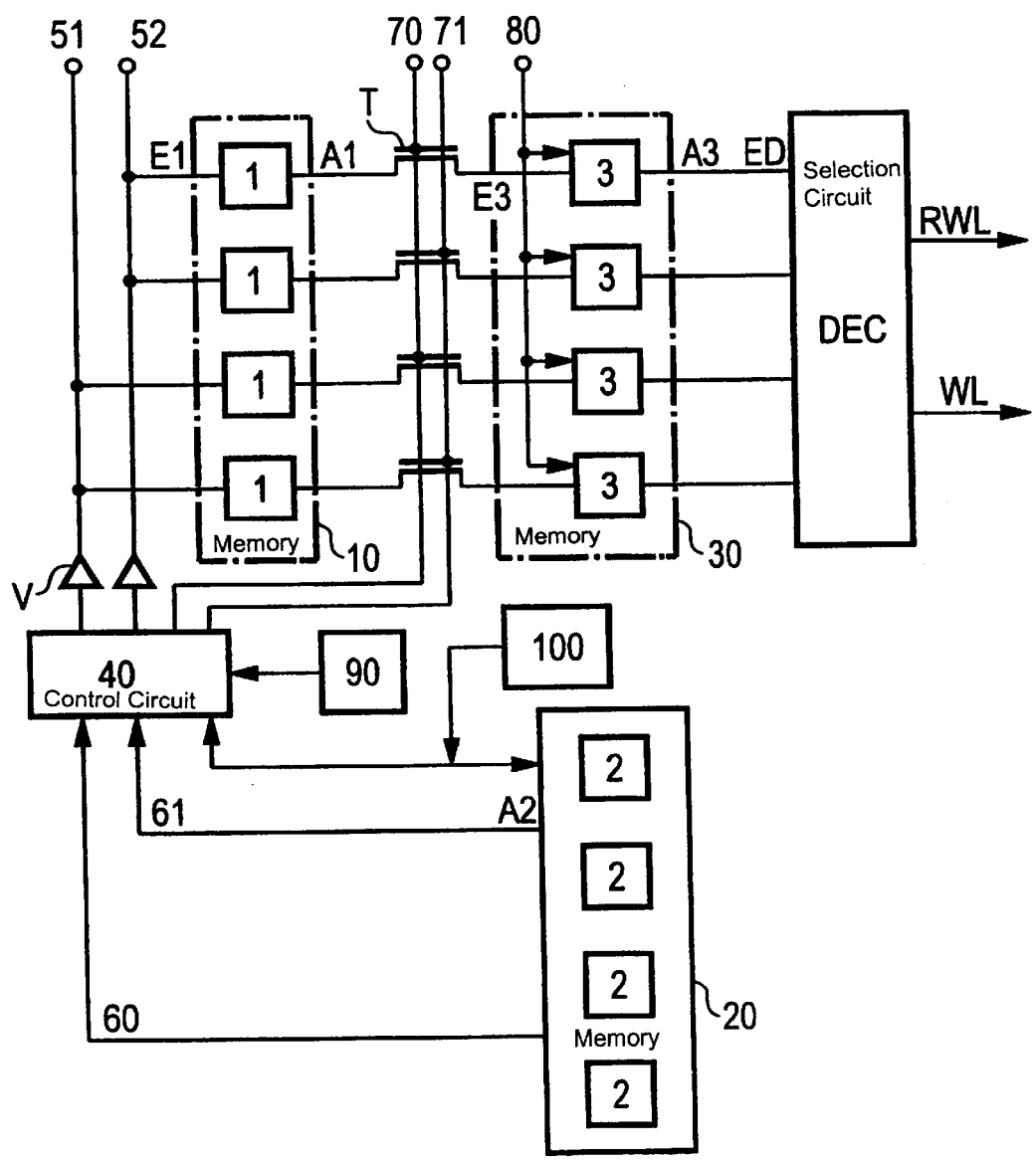
FIG. 3 is a block circuit diagram of a second embodiment of the circuit configuration according to the invention.

FIG. 3 shows a circuit configuration which, apart from the memory unit 10, has a further non-volatile memory unit 20, which is intended for storing an address of a normal unit WL to be replaced. The memory unit 20 contains non-volatile memory elements 2 that have elements that can be programmed by electrical contact, in this case in the form of electrically programmable fuses. Outputs A2 of the memory unit 20 are connected via lines 60 and 61 to a control circuit 40. The control circuit 40 is connected via lines 51 and 52 to inputs E1 of the memory unit 10. Outputs A1 of the memory unit 10 are each connected via the switching device T to inputs E3 of the memory unit 30. Outputs A3 of the memory unit 30 are connected to inputs ED of the selection circuit DEC.

The method of operation of the illustrated circuit configuration will be described in more detail in the following text.

A state of a functional unit 90 determines whether the circuit configuration, like the circuit configuration illustrated in FIG. 1, has a suitable behavior for repairing defective memory cells. In this case, signals on lines 70 and 71 are actuated jointly and identically by the control circuit 40.

Furthermore, the control circuit 40 causes the signal levels on the lines 51 and 52 to assume "logic 0" value, in this case the value of the potential V2. The circuit accordingly behaves like the circuit illustrated in FIG. 1, in which the information programmed in the memory elements 1 is transferred in parallel form to the memory elements 3 in the memory unit 30.

If the functional unit 90 assumes a corresponding different state, the address (which is stored in the memory unit 20) of a normal unit WL to be replaced is written to the memory unit 30. This depends on the memory elements 1 in the memory unit 10 having a low resistance, that is to say not being programmed. The information stored in the memory unit 20 is in this example transmitted in parallel form, in parts each containing two bits. The data are passed from the memory unit 20, via the control circuit 40, to the lines 51 and 52. In this case, it is expedient to provide two local amplifiers V, in order to amplify the signals. Therefore, the lines 51 and 52 may be configured to be relatively weak, even if a plurality of memory elements 1 are intended to be switched simultaneously. To transmit the information stored in the memory unit 20 to the memory unit 30, the switchable elements T are actuated appropriately by the control circuit 40 via the lines 70 and 71. Furthermore, a circuit 100 may be provided which, for example in the form of a timer or a synchronization circuit, coordinates the timing of the described sequence of information transmission.

In the circuit concept shown in FIG. 3, the memory unit 30 already provided in FIG. 1 is used for temporarily storing the information from the memory unit 20. Information may be transmitted via relatively long lines 60, 61, 51 and 52. The memory unit 20 may thus be accommodated in an area of the integrated circuit such that no change to the layout of the circuit is required and the area required overall is as small as possible.

We claim:

1. An integrated semiconductor memory, comprising:
    memory cells, some of said memory cells combinable to form individually addressable normal units, and others of said memory cells combinable to form individually addressable redundant units for replacement of said normal units;
    a selection circuit connected to said memory cells for selecting one of said redundant units and having an input;
    a non-volatile first memory unit for storing an address of one of said normal units to be replaced and having an output connected to said input of said selection circuit for transmission of the address stored in said first memory unit to said selection circuit, said first memory being programmable by an energy beam for programming the address; and
    a non-volatile second memory unit for storing a further address of a normal unit to be replaced and having an output connected to said input of said selection circuit for transmission of the further address stored in said second memory unit to said selection circuit, said second memory unit programmable by electrical contact for programming the further address.

2. The integrated semiconductor memory according to claim 1, including a volatile third memory unit for storing one of the address and the further address, said third memory unit connecting said first memory unit and said second memory unit to said selection circuit.

3. The integrated semiconductor memory according to claim 1, wherein said first memory unit has an input connected to said output said second memory unit, and said output of said first memory unit is connected to said input of said selection an circuit for transmitting the further address stored in said second memory unit through said first memory unit to said selection circuit.

4. The integrated semiconductor memory according to claim 3, wherein said input of said first memory unit is one of a plurality of inputs, and said output of said second memory unit is one of a plurality of outputs connected in series to at least one of said inputs of said first memory unit.

5. The integrated semiconductor memory according to claim 3, wherein said input of said first memory unit is one of a plurality of inputs, and said output of said second memory unit is one of a plurality of outputs connected in parallel to corresponding ones of said inputs of said first memory unit.

6. The integrated semiconductor memory according to claim 1, wherein said first memory unit and said second memory unit each contain non-volatile memory elements, said non-volatile memory elements of said first memory unit contain laser fuses, and said non-volatile memory elements of said second memory unit contain electrically programmable fuses.

* * * * *